United States Patent
Marek et al.

[11] Patent Number: 5,689,187
[45] Date of Patent: Nov. 18, 1997

[54] RF RECEIVER COIL CONFIGURATION FOR AN NMR SPECTROMETER

[75] Inventors: Daniel Marek, Möriken, Switzerland; Frank Laukien, Lincoln, Mass.; Oskar Schett, Uster, Switzerland

[73] Assignee: Spectrospin AG, Switzerland

[21] Appl. No.: 616,961

[22] Filed: Mar. 15, 1996

[30] Foreign Application Priority Data

Mar. 25, 1995 [EP] European Pat. Off. ............ 95104449

[51] Int. Cl.⁶ ................................................ G01V 3/00
[52] U.S. Cl. ...................................... 324/318; 324/321
[58] Field of Search ............................ 324/321, 318, 324/319, 307, 309, 300

[56] References Cited

U.S. PATENT DOCUMENTS

| | | | |
|---|---|---|---|
| 4,549,136 | 10/1985 | Zens | 324/308 |
| 4,563,648 | 1/1986 | Hill | 324/300 |
| 5,247,256 | 9/1993 | Marek | 324/321 |
| 5,545,994 | 8/1996 | Barbara | 324/321 |
| 5,572,127 | 11/1996 | Wong et al. | 324/318 |

FOREIGN PATENT DOCUMENTS

| | | | |
|---|---|---|---|
| 0453834 | 10/1991 | European Pat. Off. | G01R 33/34 |
| 1423467 | 10/1968 | Germany | G01R 33/34 |
| 1813205 | 6/1970 | Germany | G01R 33/34 |
| 4013111 | 10/1991 | Germany | G01R 33/34 |

Primary Examiner—Louis M. Arana
Attorney, Agent, or Firm—Walter A. Hackler

[57] ABSTRACT

An RF receiver coil configuration for NMR spectrometers has at least two largely mutually orthogonal RF receiver coil systems of which at least one is made from superconducting material and is at least partially cooled to a cryogenic temperature lying far below room temperature, with each RF receiver coil system comprising at least one single coil arranged symmetrically about a sample the RF receiver coil systems having differing radial separations from the sample. The inner RF receiver coil system is made from a material having differing physical characteristics in dependence on the actual operating temperature than the material of the outer RF receiver coil system, with the materials and the geometries of the RF receiver coil systems being chosen to minimize the influence of the susceptibility of the RF receiver coil system on the homogeneity of the magnetic field in the vicinity of the sample. In this fashion, the high Q values of the resonator configuration achieved by the use of superconducting material with high electrical RF conductivity can be taken advantage of while, at the same time, avoiding the substantial interfering influences of the high susceptibility of the superconducting material.

10 Claims, 2 Drawing Sheets

RF RECEIVER COIL CONFIGURATION FOR AN NMR SPECTROMETER

BACKGROUND OF THE INVENTION

The invention concerns an RF receiver coil configuration, in particular, for a high resolution nuclear magnetic resonance spectrometer having at least one RF receiver coil system for receiving nuclear magnetic resonance signals which is arranged about a sample normally at room temperature and within a homogeneous magnetic field, wherein the RF receiver coil system is at least partially cooled to a cryogenic temperature far below room temperature.

Such an RF receiver coil configuration is, for example, known in the art from DE 40 13 111 C2.

This type of RF receiver coil configuration is utilized particularly in high resolution NMR spectrometers having stringent requirements on the signal-to-noise ratio in signal detection. In order to increase the sensitivity of the receiver coil configuration in conventional devices, the RF receiver coil configuration is at least partially cooled to a cryogenic temperature lying far below room temperature. As a result, the electrical radio frequency (RF) conductivity of the coil is increased to improve the signal-to-noise ratio through reduced resonator loss. As a result, the resonator configuration has a particularly high Q which leads to a particularly high sensitivity.

In addition to the resonator system Q of the receiver device, which is substantially determined by the electrical losses in the coils, the fill-factor (the spatial configuration between the coil and the sample) also plays an import role for the resulting resolution capability of the spectrometer. Despite the presence of cooling devices for the receiving coils, which cause an increase in the Q of the resonator system, a close coupling between the receiver coils and the sample and therefore a high fill-factor can nevertheless be achieved through indirect cooling techniques, at least in configurations having only one RF receiving coil system as described in DE 40 13 111 C2.

In order to achieve a further improvement in the Q of the resonator and thereby in the resolution of the configuration, the above cited publication mentions the additional theoretical possibility of utilizing an RF receiver coil system made from superconducting material. This type of superconducting RF receiver coil system has, however, not actually been realized to date since superconducting coils are very difficult and expensive to produce and are particularly awkward when utilized for high resolution spectroscopy, since the very large magnetic field dependent susceptibility of conventional superconducting materials substantially degrades the required high homogeneity of the static magnetic field in the vicinity of the sample. The deterioration of field homogeneity at the measurement center of the apparatus leads, in turn, to a broadening of the lines and to a relative reduction in the peak values of the measured signal. The influence of the RF receiver coil configuration susceptibility is particularly troublesome for narrow lines in high resolution spectroscopy.

For magnetic field strengths in the region of approximately 100 Gauβ, the susceptibility of an ideal superconductor assumes a value of approximately $-1$. For higher field strengths in the vicinity of $10^5$ Gauβ, the susceptibility of the superconducting material is still on the order of $10^{-3}$. In contrast thereto, the susceptibility of copper in this field strength region is approximately $10^{-5}$. Due to its high susceptibility, a superconducting RF receiver coil with the same geometry therefore interferes with the field homogeneity by approximately two orders of magnitude more than a normally conducting resistive coil.

The purpose of the present invention is therefore to introduce an RF receiver coil configuration of the above mentioned kind which takes advantage of the high Q of the resonator configuration achievable with superconducting material having a high electrical RF conductivity (as already theoretically proposed), but which also avoids the substantial practical disadvantages associated with the interfering effects of high superconducting material susceptibility on the homogeneity of the static magnetic field in the vicinity of the sample and therefore on the line-width of the received NMR signals.

SUMMARY OF THE INVENTION

This purpose is achieved in accordance with the invention in that at least two RF receiver coil systems are provided for which are preferentially orthogonal to each other, with at least one being constructed from superconducting material, wherein each RF receiver coil system comprises at least one single coil arranged symmetrically about the sample, the RF receiver coil systems having differing radial separations from the sample, and the inner RF receiver coil system comprises a material exhibiting differing operating temperature dependent characteristics than the material of the outer RF receiver coil system, with the materials and the geometries of the RF receiver coil system being chosen to minimize the overall influence of the susceptibility of the RF receiver coil configuration from all RF receiver coils of the configuration at the cryogenic operating temperature of the superconducting RF receiver coil system on the homogeneity of the magnetic field in the vicinity of the sample.

RF receiver coil configurations having more than one RF receiver coil system are per se known in the art for NMR measurements on a plurality of differing nuclear species, with the RF receiver coil system being orthogonally arranged relative to the magnetic fields received and thereby being RF magnetically decoupled. Multi-coil configurations for multi-nuclear measurements are in existence having two combined transmitter and receiver coil systems with which, for example, protons and $^{13}$C-nuclear signals can be measured. Other conventional configurations provide for a second receiver coil system for locking the measuring signal onto a deuterium line. Neither of these conventional multi-coil configurations provides for either a cooling of the RF receiver coil system to cryogenic temperatures or the utilization of superconducting material for the coils. For this reason, the above mentioned problems of the negative influence of the high susceptibility of superconducting coil materials on the field homogeneity in the vicinity of the sample and therefore the substantial deterioration of the resolution capability of the NMR spectrometer do not occur with these conventional multi-coil configurations.

The RF receiver coil system which is in closest spatial proximity to the sample naturally has the largest influence on the homogeneity of the static magnetic field at the sample location. Therefore, in a particularly preferred embodiment of the RF receiver coil configuration in accordance with the invention, at least the innermost RF receiver coil system has a structure which compensates the overall external susceptibility of the system. The compensation therefore takes place locally through appropriate choice of the coil materials and an appropriate relative geometric arrangement. Since the outer RF receiver coil system located more distant from the sample has a substantially reduced effect at least with respect to homogeneity interferences caused by susceptibility, it is, for example, possible for the external systems to only have coarse susceptibility compensation or none at all without leading to substantial line-broadening and resolution losses. In addition, the outer coil systems produce longer wavelength interferences due to their larger spatial dimensions which primarily produce lower order magnetic field gradients. These, in turn, are easier to compensate for with conventional shim-systems than the short wavelength interferences from the innermost coils which produce magnetic field gradients of higher order.

In an improvement in this embodiment, the inner RF receiver coil system is made from electrically resistive material. Such a material exhibits, as discussed above, a susceptibility which is substantially less than that of superconducting material so that susceptibility compensation is easier than with a superconducting coil. The susceptibility compensation of a resistive material is, in addition, a technical problem which has been long solved so that conventional methods can be utilized. In contrast thereto, the superconducting RF receiver coil system at larger radial separation from the sample can be designed without susceptibility compensation since its larger separation causes a reduced influence of the susceptibility on the homogeneity at the sample location. The worsened fill-factor of the RF receiver coil system due to its reduced coupling can be compensated for or even more than compensated for by means of the higher resonator Q associated with the high electrical conductivity of the superconducting material.

In a concrete embodiment of such a susceptibility compensated configuration, the inner RF receiver coil system can be constructed from copper wire whose external susceptibility is compensated for with a platinum core.

In an alternative embodiment, the inner RF receiver coil system can be superconducting. Due to the close spatial separation to the sample, such a system has a particularly high fill-factor which, in conjunction with the extremely low losses in the resonator system due to the high RF conductivity of the superconductor, leads to a particularly high sensitivity of the inner RF receiver coil system and therefore to an excellent signal-to-noise ratio. In contrast thereto, the outer RF receiver coil system can, for example, be resistive and without susceptibility compensation to be more economical and easier to construct.

In a further improvement in this embodiment, all RF receiver coil systems can be superconducting. In this manner, all receiver coil systems are particularly sensitive which leads to a very high signal-to-noise ratio for the outer systems as well so that the reduced fill-factor caused by the larger radial separation from the sample is compensated for or more than compensated for.

An embodiment of the RF receiver configuration in accordance with the invention is particularly preferred in which at least one superconducting RF receiver coil system is provided for, wherein the coils comprise a thin superconducting layer on the order of several microns in thickness introduced onto a substrate. In this fashion, the amount of superconducting material utilized is substantially reduced leading to a large reduction in the negative influences of the susceptibility of the RF receiver coil system on the field homogeneity at the sample location and thereby on the line-width and on the resolution capability of the NMR spectrometer. This type of thin superconducting layer having thicknesses between approximately one and approximately ten microns, corresponding largely to the RF skin-depth, can, for example, be introduced onto the substrate with the assistance of conventional epitaxial techniques if high temperature superconducting materials are utilized.

In particular, an RF receiver coil system of this type can also be configured as a bird-cage resonator evaporated onto a support structure.

In particular, in the event that the layered superconducting system forms the inner RF receiver coil system, the extremely small spatial extent of the superconducting layer allows for a particularly high fill-factor due to the extremely good RF coupling of the coil system to the sample.

In an improvement of this embodiment the substrate upon which the electrically conducting layer is deposited can be a low-loss dielectric having high heat conductivity at low temperatures. In particular, in conjunction with an indirect cooling of the superconducting RF receiver coil system, the substrate can, for example, comprise sapphire or quartz tubes. Such a configuration not only leads to a substantial reduction of ohmic losses in the receiver coil system, but also achieves a substantial reduction in the capacitive losses in the RF resonator system (consisting of the receiver coil and the capacitive tuning).

In another embodiment, a metal block made, in particular, from copper or aluminum is in heat conducting contact with the substrate to form a cooled platform. This facilitates a particularly simple indirect cooling which is particularly advantageous when the relevant coil system is in vacuum, since the configuration can be made to be very compact. The cooled platform thereby serves for heat conduction to the cryogenic medium.

Embodiments of the RF receiver coil configuration in accordance with the invention are preferred with which at least a part of the RF receiver coil is indirectly cooled, since this is easily realized in vacuum for the geometric reasons mentioned above.

In other embodiments, at least a part of the RF receiver coil can be directly cooled to facilitate a more efficient heat conduction away from the coils.

Finally, an embodiment is particularly advantageous with which the RF receiver coil system is in vacuum about the sample. In this fashion, a particularly simple thermal isolation of the cooled coils from the room temperature sample can be realized. Only one single Dewar vessel wall, rather than a double-walled configuration, is thereby required so that the RF receiver coil system can be arranged in closer spatial proximity to the sample to thereby achieve an improved fill-factor for the resonator configuration.

The invention is described and explained more closely below with reference to the embodiments in the drawing and the related description. The features which can be extracted from the description and the drawing can be utilized in embodiments of the invention individually or collectively in arbitrary combination.

DESCRIPTION OF THE PREFERRED EMBODIMENT

Figure 1:
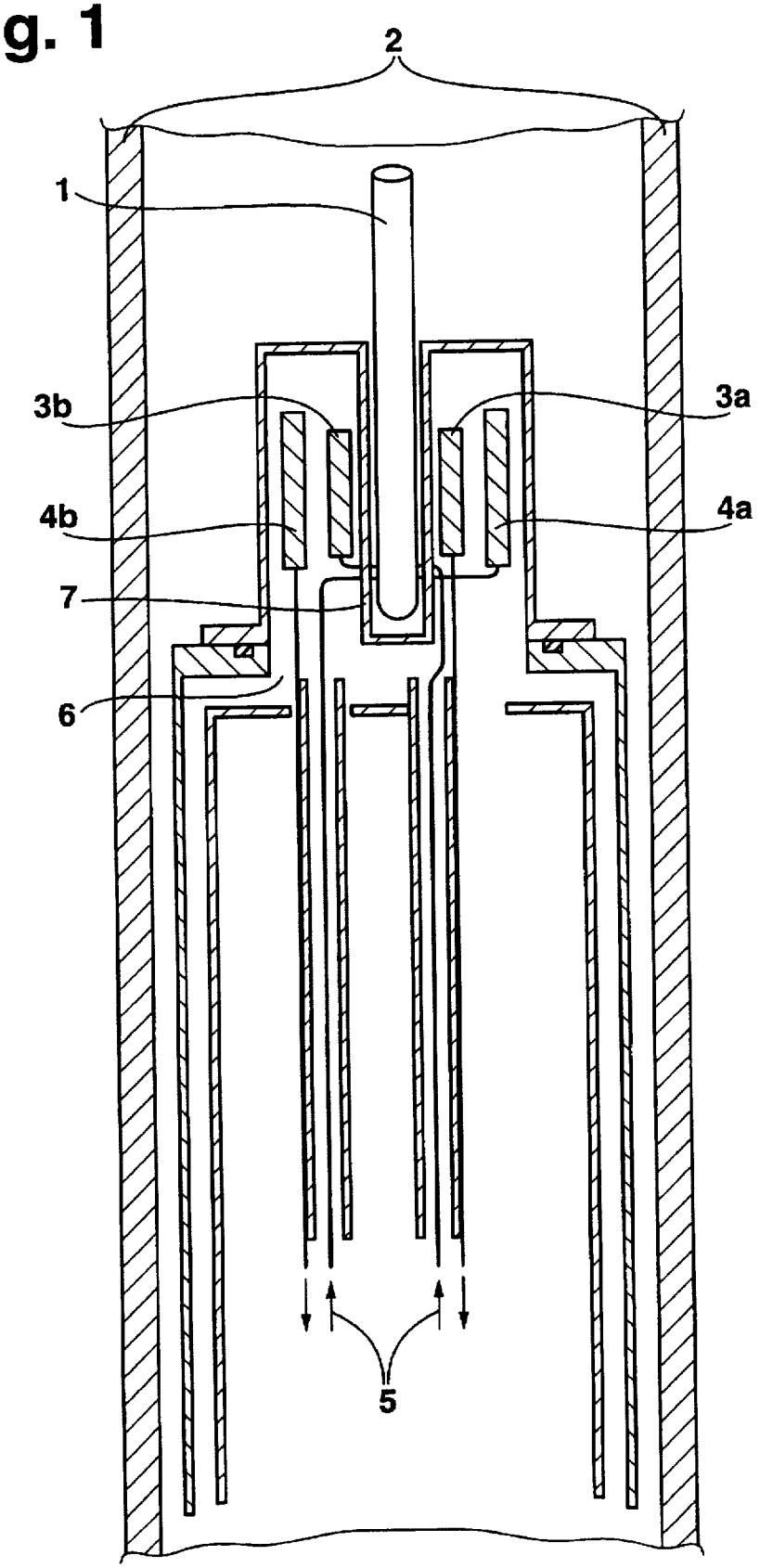
FIG. 1 shows a schematic cut representation of a configuration of two RF receiver coil systems in accordance with the invention with direct cooling from within caused by the flowing of a cryogenic medium.

The RF receiver coil configuration shown in FIG. 1, which is, in particular, utilized in high resolution nuclear magnetic resonance spectrometers, has a sample 1 in a homogeneous field of a magnet 2 surrounded by two RF receiver coil systems and arranged largely orthogonal with respect to each other, each of which comprises individual coils 3a, 3b and 4a, 4b respectively arranged symmetrically about the sample 1. The RF receiver coil systems 3a, 3b; 4a, 4b exhibit differing radial separations from the sample 1 to facilitate an orthogonal spatial configuration.

In order to achieve as low an ohmic loss as possible and a particularly good signal-to-noise ratio for this resonator configuration, both RF receiver coil systems in the example shown are given the shape of bent tubes having a cryogenic fluid 5 flowing through them to thereby be cooled from within. In other embodiments, the cooling can take place indirectly or be restricted to only one part of the coil. At least one of the RF receiver coil systems 3a, 3b; 4a, 4b and possibly both systems are constructed from superconducting material with the inner RF receiver coil system 3a, 3b consisting of a different material than the outer RF receiver coil-system 4a, 4b. The materials utilized have differing physical properties in dependence on the operating temperature and are chosen according to the associated geometry of the RF receiver coil system to minimize the influence of the susceptibility of the RF receiver coil configuration resulting from all RF receiver coils of the configuration at the cryogenic operating temperature of the superconducting RF receiver coil system on the homogeneity of the magnetic field in the region of sample 1.

The susceptibility compensation is generally accomplished locally, i.e. the corresponding coils are each individually externally susceptibility compensated. It is preferred when at least the inner RF receiver coil system 3a, 3b is susceptibility compensated. Both the resistive as well as the superconducting RF receiver coil systems of the configuration can each be susceptibility compensated. It is also possible for all RF receiver coil systems to be superconducting. When the inner RF receiver coil system 3a, 3b is superconducting at least this coil should be susceptibility compensated, since it is in closest spatial proximity to the sample 1 and the interfering influence of its susceptibility on the homogeneity of the magnetic field at the sample location is particularly large.

On the other hand, a hybrid configuration can also be advantageous with which a preferentially susceptibility compensated resistive coil system is utilized as the inner RF receiver coil system 3a, 3b, and no or only coarse susceptibility compensation is necessary for the outer RF receiver coil system 4, 4b to substantially reduce the manufacturing difficulties and thereby the costs of the apparatus. The susceptibility compensated resistive inner RF receiver coil system can, in a conventional fashion, be constructed from susceptibility compensated copper wire having a platinum core.

It is preferred when the RF receiver coil systems 3a, 3b; 4a, 4b are arranged within a vacuum 6 so that only one single separation wall 7 is necessary for the thermal decoupling with respect to the sample 1, which is normally located at room temperature, to facilitate a substantially reduced spatial separation between the inner RF receiver coil system 3a, 3b, and the sample 1 for effecting a particularly good RF coupling of the resonator system and thereby a particularly high fill-factor.

Figure 2:
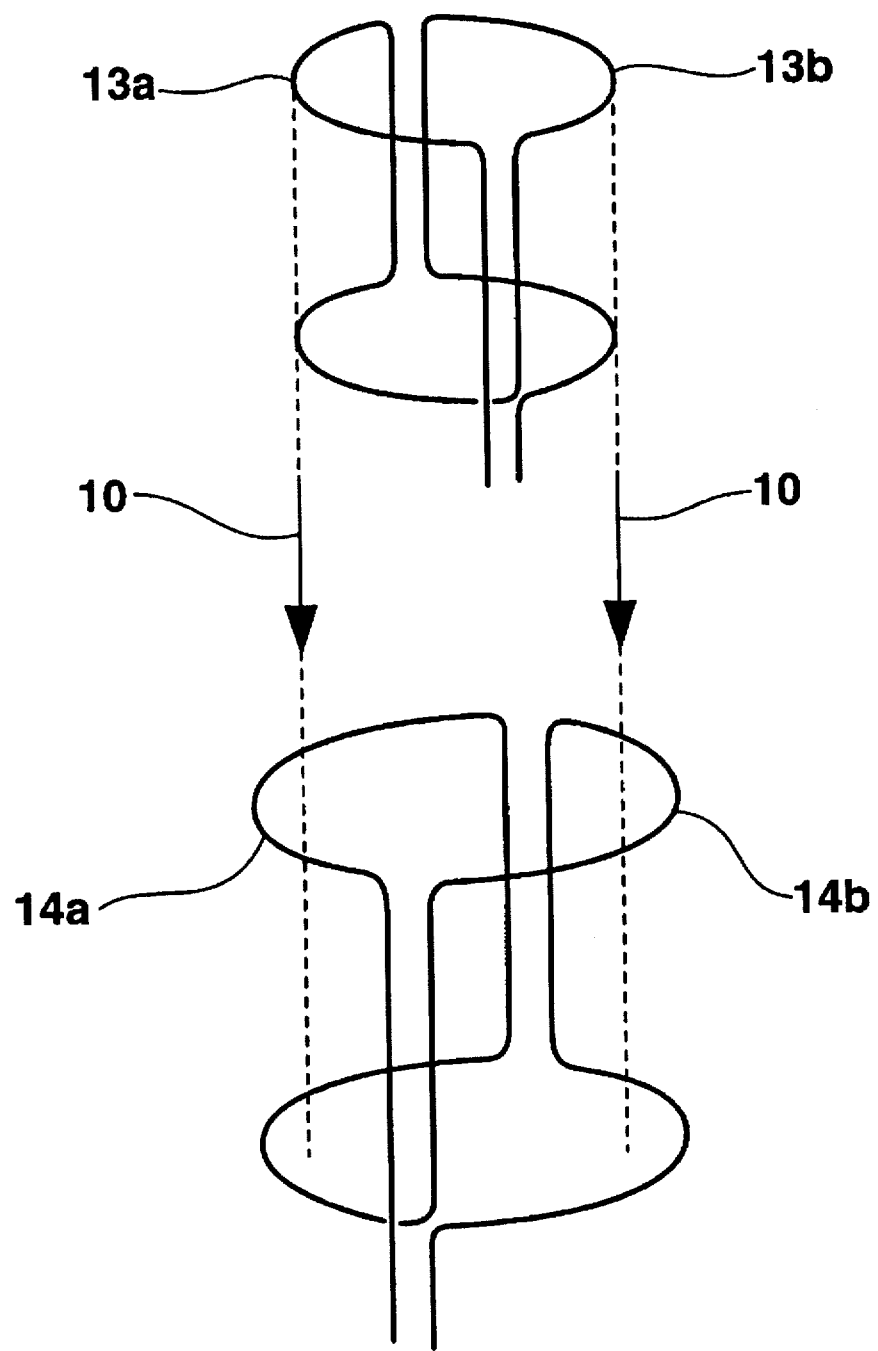
FIG. 2 shows a schematic spatial representation of an RF receiver coil configuration in accordance with the invention showing the outer RF receiver coil system in the lower part of the figure and the inner RF receiver coil configuration in the upper part which is surrounded thereby.

FIG. 2 shows an RF receiver coil configuration in a schematic spatial representation. For reasons of clarity, the inner RF receiver coil system 13a, 13b is shown axially displaced above the outer RF receiver coil system 14a, 14b.

In the operating state of the apparatus, the inner RF receiver coil system 13a, 13b is inserted in the direction of arrow 10 into the outer RF receiver coil system 14a, 14b and the two RF receiver coil systems are arranged largely orthogonal to each other for facilitating a maximum decoupling of the received NMR signals.

In the RF receiver coil configuration in accordance with the invention, the RF receiver coils can be simultaneously utilized as RF transmitter coils to effect a compact receiver configuration and to substantially simply its geometry.

The superconducting RF receiver coil system preferentially comprises a thin superconducting layer with a thickness of a few microns introduced onto a substrate, for example, a sapphire or quartz tube. In embodiments not represented in the drawing, the substrate can be in direct heat-conducting contact with a metal block made, in particular, from copper or aluminum to form therewith a cooled platform with which the superconducting layer is directly cooled in a particularly compact manner.

A compensation to approximately 1% of the susceptibility of the copper is usually effected when utilizing resistive copper wire in RF receiver coil configurations. Since, as mentioned above, commercially available superconducting materials have a susceptibility which is two orders of magnitude larger than that of copper even at high magnetic field strengths and cryogenic temperatures, in the event of a straightforward thickness compensation the superconducting coil would have to have a volume four orders of magnitude less than that of the resistive coil in order to equally compensate for the damaging influence of the susceptibility on the homogeneity of the magnetic field at the sample location.

Conventional wire thicknesses utilized in RF receiver coil systems are about 0.2 to 0.3 mm. In contrast thereto, when utilizing thin superconducting layers on the order of 0.005 mm in thickness, the interfering effects of the susceptibility are approximately one order of magnitude lower due to the volume reduction. Expressed in another way, in order to achieve the same susceptibility influence on the homogeneity of the magnetic field at the sample location it is sufficient to utilize a thin superconducting layer as an RF receiver coil system having only a susceptibility compensation of 10% of the susceptibility of copper, which is an order of magnitude less than the usual compensation for copper wire to approximately 1% of the susceptibility of copper. Viewed in another way, the utilization of the above mentioned thin superconducting layer allows for the complete elimination of susceptibility compensation for the superconducting RF receiver coil system, and only in the event that conditions are otherwise the same as in a resistive configuration, the influence of the susceptibility on the magnetic field homogeneity at the sample location is increased by approximately an order of magnitude. This is completely acceptable in measurements of broad NMR lines, although not for measurements in high resolution NMR.

We claim:

1. A susceptibility compensated RF receiver system for receiving a first and a second NMR resonance signal from a sample located in homogeneous magnetic field, the system being at least partially cooled to a cryogenic temperature and comprising: a first superconducting coil for detecting the first signal and having a first coil member symmetrically arranged about the sample, said first superconducting coil having a first radial separation from the sample and a first material composition, said first material composition having a substrate and a superconducting layer introduced onto said substrate said layer having a thickness corresponding to an RF skin depth; and a second coil for detecting the second signal and having a second coil member symmetrically arranged about the sample, said second coil member coaxial with said first coil member, said second coil having a second radial separation from the sample which is greater than said first radial separation, said second coil having a second material composition, wherein said first and second coils are disposed and each of said first and second compositions is selected to minimize an influence of a susceptibility of said first coil on the homogeneous magnetic field at the sample and to minimize an influence of a susceptibility of said second coil on the homogeneous magnet field at the sample.

2. The RF receiver system of claim 1, wherein said first coil has a first structure which compensates a first overall external susceptibility of said first coil.

3. The RF receiver system of claim 2, wherein said second coil is superconducting.

4. The RF receiver system of claim 1, wherein said second material composition has an electrical resistance and said second coil has a second structure which compensates a second overall external susceptibility of said second coil.

5. The RF receiver system of claim 4, wherein said second material composition comprises susceptibility compensated copper wire having a platinum core.

6. The RF receiver system of claim 1, wherein said substrate comprises a low-loss dielectric having high heat conductivity at low temperature.

7. The RF receiver system of claim 1, wherein said substrate comprises a metal block in heat conducting contact with said superconducting layer.

8. The RF receiver system of claim 1, wherein a part of the RF receiver system is indirectly cooled.

9. The RF receiver coil of claim 1, wherein a part of the RF receiver system is directly cooled.

10. The RF receiver coil system of claim 1, wherein the receiver system is arranged in vacuum.

* * * * *